(12) United States Patent
Shlick et al.

(10) Patent No.: US 10,162,538 B2
(45) Date of Patent: Dec. 25, 2018

(54) MEMORY OPERATION THRESHOLD ADJUSTMENT BASED ON BIT LINE INTEGRITY DATA

(71) Applicant: SANDISK TECHNOLOGIES LLC, Plano, TX (US)

(72) Inventors: Mark Shlick, Ganey-Tikva (IL); Refael Ben-Rubi, Rosh Haayin (IL); Uri Shir, Ra'anana (IL); Ahiad Turgeman, Omer (IL); Uri Peltz, Hod-Hasharon (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 482 days.

(21) Appl. No.: 14/871,262

(22) Filed: Sep. 30, 2015

(65) Prior Publication Data

US 2017/0090788 A1    Mar. 30, 2017

(51) Int. Cl.
*G06F 3/06* (2006.01)
*G11C 29/04* (2006.01)

(52) U.S. Cl.
CPC ............ *G06F 3/0619* (2013.01); *G06F 3/065* (2013.01); *G06F 3/0679* (2013.01); *G11C 29/04* (2013.01)

(58) Field of Classification Search
CPC . G06F 11/1012; G06F 3/0619; G11C 29/846; G11C 29/56008; G11C 29/808
See application file for complete search history.

(56) References Cited

U.S. PATENT DOCUMENTS

| | | | |
|---|---|---|---|
| 6,426,893 B1 * | 7/2002 | Conley | G06F 12/0246 365/185.09 |
| 7,324,389 B2 * | 1/2008 | Cernea | G11C 29/846 365/189.05 |
| 8,190,950 B2 | 5/2012 | Chen et al. | |
| 9,146,807 B2 * | 9/2015 | Yurzola | G06F 11/1068 |
| 9,317,361 B2 * | 4/2016 | Alhussien | G06F 11/1012 |
| 9,786,388 B1 * | 10/2017 | Nassie | G11C 29/56008 |
| 2012/0075943 A1 | 3/2012 | Chen et al. | |
| 2014/0157087 A1 | 6/2014 | Yurzola et al. | |

* cited by examiner

*Primary Examiner* — Tri Hoang
(74) *Attorney, Agent, or Firm* — Kunzler, PC

(57) ABSTRACT

A data storage device includes a controller and a memory. The memory is coupled to the controller. The memory includes storage elements coupled to bit lines. The controller is configured to access bit line integrity data corresponding to a region of the memory, the bit line integrity data indicating a number of bit lines. The controller is also configured to store data related to a memory operation threshold based on the number of bit lines.

20 Claims, 7 Drawing Sheets

MEMORY OPERATION THRESHOLD ADJUSTMENT BASED ON BIT LINE INTEGRITY DATA

FIELD OF THE DISCLOSURE

The present disclosure is generally related to electronic devices and more particularly to memory operation threshold adjustment based on bit line integrity data.

BACKGROUND

Storage devices enable users to store and retrieve data. Examples of storage devices include volatile memory devices and non-volatile memory devices. Portions of a memory device may be defective. For example, one or more storage elements of the memory device may be defective. A defective storage element may be unreliable. For example, a defective storage element may not be reliably programmed to a particular state. To illustrate, a first value written to the storage element may not match a second value read from the storage element. In some cases, the memory device may include a bad bit line. For example, multiple storage elements coupled to a bad bit line may be defective. The memory device may include an array of storage elements. The array may include multiple columns of storage elements. Each column may include multiple bit lines. For example, a column may include storage elements coupled to a first number (e.g., 16) of bit lines. A column containing at least one bad (e.g., defective) bit line may be considered a bad column.

A memory device may include redundant storage elements. A bad column may be replaced with a first column of the redundant storage elements. In this case, read/write circuitry of the memory device redirects read/write accesses from the bad column to the first column. The bad column may be designated as unavailable. In this case, even if fewer than all of the bit lines of the column are defective, the entire bad column is replaced. Storage elements coupled to non-bad bit lines of the column are replaced with redundant storage elements, reducing the number of redundant storage elements available to replace other defective storage elements. Some of the storage capacity of the memory device corresponding to elements coupled to non-bad bit lines of a bad column may be wasted (e.g., unused) when an entire bad column is designated as unavailable due to the presence of one or more few bad bit lines in the bad column.

DETAILED DESCRIPTION

Figure 1:
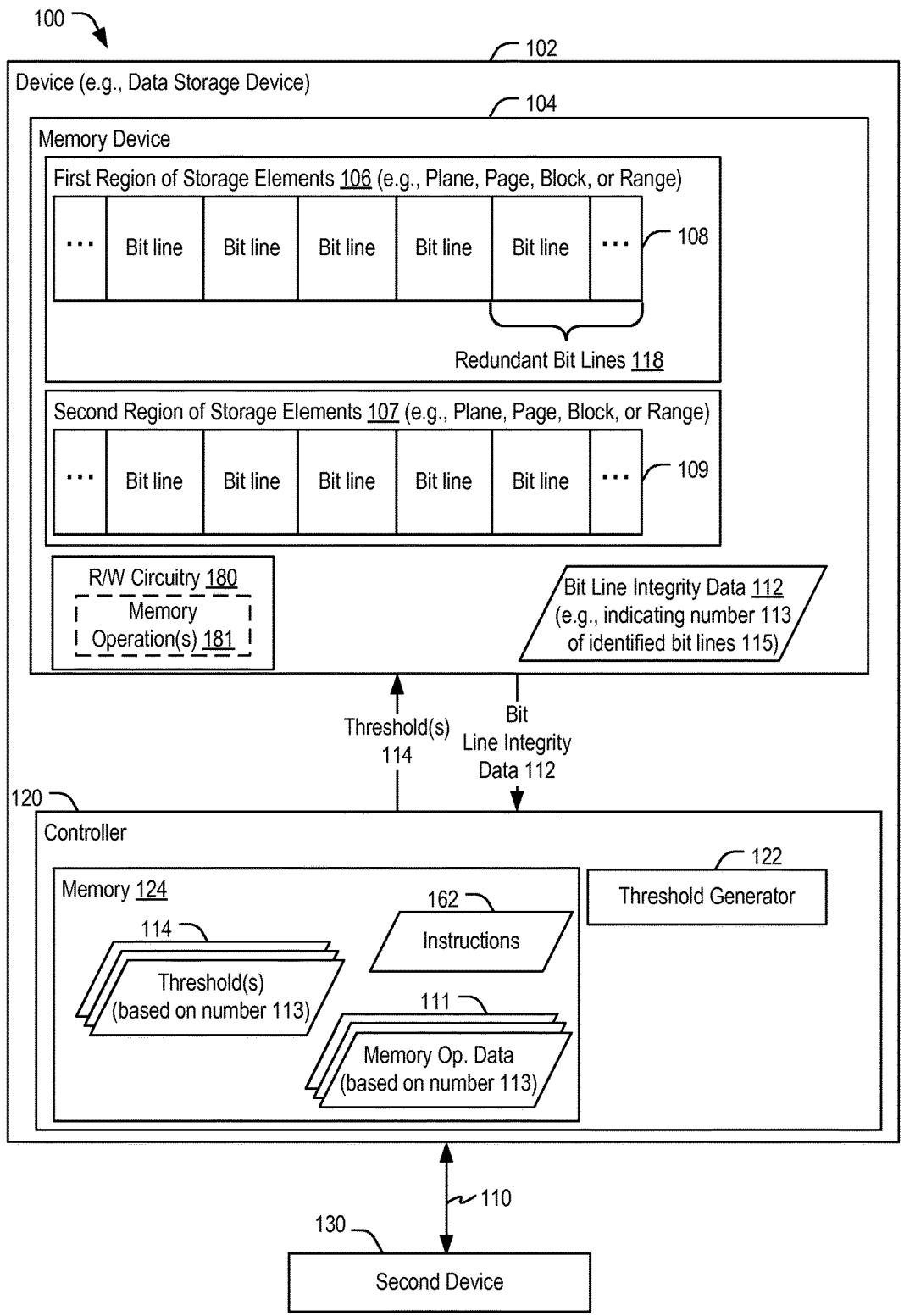
FIG. 1 is a diagram of a particular illustrative example of a system that includes a device, such as a data storage device.

A data storage device may include a memory array of storage elements. The storage elements may be coupled to bit-lines and word-lines. A storage element may be coupled to a bit-line and a word-line. A value (e.g., a 1-bit value) may be read from the storage element by sensing the bit-line while the word-line is activated. The memory array may include columns of storage elements. A column may include multiple (e.g., 16) bit-lines. In accordance with the present disclosure, when a column includes a bad bit line, the bad bit line may be replaced by a redundant bit line without replacing the remaining non-bad bit lines of the column. That is, the systems and methods of the present disclosure enable "bad bit line-correction" as an alternative to "column-replacement," where column-replacement includes replacing all bit lines of a column even if only some of the bit lines of the column are defective.

To illustrate, a data storage device may include a memory device and a controller, and bad bit lines of the memory device may be identified during a bit line integrity operation. For example, the memory device may include a memory array of storage elements. A defective storage element of the memory array may be identified by determining that a value read from the storage element does not match another value written to the storage element. A bad bit line may be identified by determining that multiple storage elements coupled to the bit line are defective. Bit line integrity data maintained at the data storage device may include bad bit line data indicating the bit lines that are identified as bad bit lines during the bit line integrity operation. The bit line integrity data may indicate a number of the bad bit lines.

The memory array may include redundant storage elements. A bad group of storage elements may be replaced with a redundant group of storage elements. For example, when a first bit line of a first column is identified as a bad bit line, the first bit line may be "replaced" with a first redundant bit line without replacing the entire first column, which may include at least one non-bad bit line. For example, a second bit line of the first column not identified as non-bad is not replaced and remains available for use. Thus, storage elements coupled to the second bit line may remain available for use.

For a given column, bad bit line-correction may use fewer redundant bit lines than column-replacement. Bad bit line-correction may therefore make additional redundant bit lines available to replace defective bit lines of other columns or to store parity data.

Using bad bit line-correction instead of column-replacement may increase an error tolerance of the memory device. For example, a memory device may include a first number of redundant bit lines and a column of the memory device may include a second number of bit lines. If column-replacement were used, the memory device would have the capacity to replace less than or equal to a threshold number (e.g., the first number divided by the second number) of columns. To illustrate, if the memory device has as many redundant bit lines as are included in a single column, then the memory device has the capacity to replace at most a single column. If bad bit line-correction is used, in cases when fewer than all bit lines of a column are defective, the memory device may replace the defective bit lines of the column with a subset of the first number of redundant bit lines and the remaining redundant bit lines remain available to store parity data or to replace defective bit lines of another column. Increasing the number of bit lines available to store parity data or to replace defective bit lines increases the error tolerance of the memory device.

Read/write circuitry of the memory device may provide different sets of data to the controller in bad bit line-correction cases than in column-replacement cases. For example, in column-replacement, the read/write circuitry may provide first data (e.g., responsive to a read request) corresponding to non-bad columns of a region of storage elements, redundant columns corresponding to bad columns of the region of storage elements, and parity data corresponding to the region of storage elements to the controller. In column-replacement cases, the read/write circuitry may not provide data corresponding to the bad columns to the controller. In bad bit line-correction, the read/write circuitry provides second data corresponding to the bad columns (e.g., bad bit lines and non-bad bit lines), redundant bit lines corresponding to the bad bit lines, and parity data to the controller.

At various times, the controller may perform bit line integrity operations to identify bad bit lines. For example, a bit line integrity operation may be performed during a memory test or an initialization of the memory device. In a particular implementation, the bit line integrity operation may be performed periodically. The bit line integrity operation may be performed "in the background" during operation at the data storage device. For example, prior to performing a bit line integrity operation to identify bad bit lines of a region of storage elements, data from the region of storage elements may be copied to another (e.g., redundant) region of storage elements. Read/write accesses to the region of storage elements may be redirected to the redundant region of storage elements. In a particular example, subsequent to performing the bit line integrity operation, data from the redundant region of storage elements may be copied to the region of storage elements.

During the bit line integrity operation, the controller may detect a defective storage element in response to determining that first data written to the storage element does not match second data read from the storage element. The controller may identify a bit line as a bad bit line in response to determining that multiple defective storage elements are coupled to the bit line. The controller may generate bit line integrity data indicating a number (e.g., a count) of the identified bit lines (e.g., the bad bit lines). The controller may store the bit line integrity data at the memory device.

The memory device may provide the bit line integrity data to the controller. For example, the memory device may provide the bit line integrity data to the controller in response to a request from the controller. Because different data is provided to the controller when bad bit line-correction is used than when column-replacement is used, memory operation thresholds used when column-replacement is used may not be applicable to memory operations that are performed when bad bit line-correction is used. Accordingly, the present disclosure describes generating/updating different thresholds for bad bit line-correction cases. For example, the controller may update (e.g., increment or overwrite) a threshold (e.g., a memory operation threshold) based on the number of the identified bit lines. For example, the controller may set the memory operation threshold to indicate the number of identified bit lines. As another example, the controller may set the memory operation threshold to indicate a sum of a first threshold value and the number of identified bit lines. The first threshold value may include a default value or may be based on an error correction code (ECC) algorithm.

The memory operation threshold may indicate a number of errors that are correctable in data received by the controller from the memory device. The received data may correspond to bad columns (e.g., bad bit lines and non-bad bit lines), non-bad columns, and redundant columns. The controller may provide the updated memory operation threshold to the memory device.

At various times, the read/write circuitry may perform control operations (e.g., memory operations) that use the memory operation threshold. For example, the read/write circuitry may perform a memory operation to determine whether a number of errors detected in data read from a region of storage elements is greater than the number of errors that are correctable by the controller. The memory operation may include a program confirmation operation, an erase detection operation, a read voltage adjustment operation, a data move operation, or a test read operation, as illustrative, non-limiting examples. The read/write circuitry may perform various actions in response to determining whether the number of detected errors is greater than the number of correctable errors, as further described herein.

Particular aspects of the disclosure are described below with reference to the drawings. In the description, common or similar features or components may be designated by common reference numbers. As used herein, "exemplary" may indicate an example, an implementation, and/or an aspect, and should not be construed as indicating a preference or a preferred implementation.

Referring to FIG. 1, a particular illustrative example of a system is depicted and generally designated 100. The system 100 includes a device 102 (e.g., a data storage device) and a second device 130 (e.g., a host device, a test device, or an access device). The device 102 and the second device 130 may be operationally coupled via a connection (e.g., a communication path 110), such as a bus or a wireless connection.

The device 102 includes a memory device 104. The memory device 104 may include an array of storage elements (e.g., non-volatile storage elements). The memory device 104 may include a flash memory (e.g., a NAND flash memory) or a resistive memory, such as a resistive random access memory (ReRAM), as illustrative examples. The memory device 104 may have a three-dimensional (3D) memory configuration. As used herein, a 3D memory device may include multiple physical levels of storage elements (instead of having a single physical level of storage elements, as in a planar memory device). As an example, the memory device 104 may have a 3D vertical bit line (VBL) configuration. In a particular implementation, the memory device 104 is a non-volatile memory having a 3D memory array configuration that is monolithically formed in one or more physical levels of arrays of memory cells having an active area disposed above a silicon substrate. Alternatively, the memory device 104 may have another configuration, such as a two-dimensional (2D) memory configuration or a non-monolithic 3D memory configuration (e.g., a stacked die 3D memory configuration).

In some examples, the system 100 may correspond to a solid state drive (SSD), such as found in computing devices, such as laptop computers and tablet computers. In some implementations, the system 100, the device 102, or the memory device 104 may be integrated within a network-accessible data storage system, such as an enterprise data system, a network-attached storage (NAS) system, or a cloud data storage system, as illustrative examples.

The memory device 104 includes one or more regions of storage elements (e.g., a first region of storage elements 106, a second region of storage elements 107, or both) and read/write (R/W) circuitry 180. A region of storage elements may include a plane, a page, a block, or a range of storage elements. For example, the memory device 104 may include a plurality of planes of storage elements. The first region of storage elements 106 may correspond to a first plane of the plurality of planes. The second region of storage elements 107 may correspond to a second plane of the plurality of planes. Each region of the memory device 104 may be coupled to distinct bit lines. For example, the first region of storage elements 106 may be coupled to a first plurality of bit lines 108. The second region of storage elements 107 may be coupled to a second plurality of bit lines 109 that is distinct from the first plurality of bit lines 108. A region of storage elements of the memory device 104 may include one or more redundant bit lines. For example, the first region of storage elements 106 may include one or more redundant bit lines 118. The redundant bit lines 118 may be available to replace one or more bad bit lines of the first region of storage elements 106.

The memory device 104 may be configured to store bit line integrity data corresponding to one or more regions of storage elements. For example, the memory device 104 may store bit line integrity data 112 corresponding to the first region of storage elements 106. As another example, the memory device 104 may store second bit line integrity data corresponding to the second region of storage elements 107, as further described with reference to FIG. 2. The bit line integrity data 112 may include bad bit line data corresponding to the first region of storage elements 106. To illustrate, the bit line integrity data 112 may indicate bit lines 115 of the first region of storage elements 106 that are identified as "bad" (e.g., defective). For example, the bad bit lines 115 may be identified during a bit line integrity operation, as further described with reference to FIGS. 3-4. The bit line integrity data 112 may indicate a number (or count) 113 of the identified bit lines 115.

The device 102 may further include a controller 120 coupled to the memory device 104. In some implementations, the controller 120 resides on a semiconductor die, which may be the same as or different from semiconductor die(s) of the memory device 104. The controller 120 may include a threshold generator 122, memory 124 (e.g., random access memory (RAM)), or both. The threshold generator 122 may include a processor configured to execute software (e.g., one or more instructions 162) to perform operations described herein. Alternatively, the threshold generator 122 may include hardware configured to perform operations described herein. The memory 124 may be configured to store the instructions 162.

During operation, the controller 120 may receive the bit line integrity data 112 from the memory device 104. For example, the controller 120 may receive the bit line integrity data 112 during an initialization process. The threshold generator 122 may "screen" the memory device 104 based on the bit line integrity data 112. For example, the threshold generator 122 may determine that the memory device 104 is unavailable for use in response to determining that number 113 of the identified (bad) bit lines 115 is greater than a screening threshold. In this example, the screening threshold may correspond to a number (e.g., a count) of redundant bit lines (e.g., the redundant bit lines 118) that are available to replace one or more bad bit lines (e.g., the bit lines 115) of the first region of storage elements 106. Alternatively, the threshold generator 122 may determine that the memory device 104 is available for use in response to determining that the number 113 is less than or equal to the screening threshold.

The threshold generator 122 may determine memory operation data 111 in response to determining that memory device 104 is available for use. For example, the threshold generator 122 may determine the memory operation data 111 based on the number 113 of the identified bit lines 115. To illustrate, the threshold generator 122 may determine the memory operation data 111 by applying a function (e.g., a product, a ratio, or a sum) to the number 113. In a particular aspect, based on a random distribution of errors, a first portion (e.g., half) of the identified bit lines 115 may store expected (e.g., correct or non-erroneous) values and a second portion (e.g., half) of the identified bit lines 115 may store erroneous values. As used herein, a bit line may be said to "store" a value when one or more storage elements coupled to the bit line store the value. The threshold generator 122 may determine the memory operation data 111 based on the second portion of the identified bit lines 115. For example, the memory operation data 111 (e.g., the number 113 divided by two) may correspond to an estimated number of the identified bit lines 115 that are predicted to store an erroneous value. The memory operation data 111 may be equal to a nearest integer greater than the number 113 divided by two when the number 113 is an odd integer.

The memory operation data 111 may indicate values of one or more thresholds 114 (e.g., the screening threshold, a program confirmation threshold, an erase detection threshold, a read voltage adjustment threshold, a data move threshold, an on-chip copy (OCC) threshold, or a combination thereof). As another example, the memory operation data 111 may indicate one or more threshold offsets corresponding to the thresholds 114. In a particular implementation, the memory operation data 111 may include a first value corresponding to a first threshold (e.g., the program confirmation threshold) of the thresholds 114 and a second value corresponding to another threshold (e.g., the erase detection threshold) of the thresholds 114. For example, the threshold generator 122 may determine the first value by applying a first function (e.g., divide by two) to the number 113 and may determine the second value by applying a second function (e.g., divide by three) to the number 113. The threshold generator 122 may store the memory operation data 111 in the memory 124, the memory device 104, or both. The memory device 104, the memory 124, or both, may include non-volatile memory and the memory operation data 111 may be stored in the non-volatile memory.

The threshold generator 122 may update the thresholds 114 based on the memory operation data 111. For example, the threshold generator 122 may update (e.g., increment) or overwrite the first threshold of the thresholds 114 based on the first value of the memory operation data 111. An initial value of the first threshold may correspond to a default value. The initial value of the first threshold may indicate a number of detected errors that are correctable by the controller 120 in column-replacement cases. For example, in column-replacement cases, the controller 120 may receive first data corresponding to non-bad columns, redundant columns, and parity data from the memory device 104. The initial value of the first threshold may indicate the number of detected errors in the first data that are correctable by the controller 120. For example, errors in the non-bad columns and the redundant columns may be correctable by the controller 120 based on the parity data.

The threshold generator 122 may update (e.g., increment) the first threshold based on the first value. The updated first threshold may indicate a number of detected errors that are correctable by the controller 120 in bad bit line-correction cases. For example, in bad bit line-correction cases, the controller 120 may receive second data corresponding to bad columns, non-bad columns, redundant bit lines, and parity data from the memory device 104. The updated first threshold may indicate the number of detected errors in the second data that are correctable by the controller 120. For example, the controller 120 may correct errors in non-bad bit lines of the bad columns, the non-bad columns, and the redundant bit lines based on the parity data. The controller 120 may correct errors in bad bit lines of the bad columns by disregarding the bad bit lines or by replacing the bad bit lines with the redundant bit lines.

The threshold generator 122 may provide the thresholds 114 to the memory device 104, as shown in FIG. 1. The R/W circuitry 180 may perform one or more memory operations 181 (e.g., an erase detection operation, a program confirmation operation, a read voltage adjustment operation, a data move operation, or a test read operation) based on the thresholds 114.

The R/W circuitry 180 may perform an erase detection operation to identify regions of storage elements that are erased. The R/W circuitry 180 may perform one or more erase detection operations during an initialization (e.g., on power-up) of the memory device 104. During an erase detection operation, the R/W circuitry 180 may determine a first number of detected errors corresponding to the first region of storage elements 106. For example, the R/W circuitry 180 may determine that the first region of storage elements 106 includes a first number of storage elements that are non-erased. To illustrate, a particular voltage may correspond to an erase state. The R/W circuitry 180 may determine that a storage element is non-erased in response to determining that a threshold voltage of the storage element is less than the particular voltage.

The R/W circuitry 180 may determine whether the first number of detected errors is within an error tolerance of the controller 120 based on the thresholds 114. For example, the R/W circuitry 180 may determine (e.g., confirm) that the first region of storage elements 106 is erased in response to determining that the first number of detected errors is less than or equal to an erase detection threshold. Alternatively, the R/W circuitry 180 may determine that the first region of storage elements 106 is not erased in response to determining that the first number of detected errors is greater than the erase detection threshold. The R/W circuitry 180 may perform an erase operation on the first region of storage elements 106 in response to determining that the first number of detected errors is greater than the erase detection threshold.

The R/W circuitry 180 may perform a program confirmation operation subsequent to programming (e.g., writing data to) the first region of storage elements 106 to determine whether the first region of storage elements 106 has been programmed successfully. During a program confirmation operation, the R/W circuitry 180 may determine a first number of detected errors corresponding to the first region of storage elements 106. For example, the R/W circuitry 180 may determine that the first region of storage elements 106 includes the first number of storage elements that store erroneous data. To illustrate, the R/W circuitry 180 may perform a write operation to write a first value to a storage element. The R/W circuitry 180 may determine that the storage element stores erroneous data in response to reading a second value from the storage element that is distinct from the first value.

The R/W circuitry 180 may determine (e.g., confirm) that the first region of storage elements 106 is programmed in response to determining that the first number of detected errors is less than or equal to a program confirmation threshold. Alternatively, the R/W circuitry 180 may determine that the first region of storage elements 106 is not programmed in response to determining that the first number of detected errors is greater than the program confirmation threshold. The R/W circuitry 180 may perform a write operation on the first region of storage elements 106, for example to attempt to reprogram the first region of storage elements 106, in response to determining that the first number of detected errors is greater than the program confirmation threshold.

The R/W circuitry 180 may periodically perform a read voltage adjustment operation on regions of storage elements to detect storage elements for which read voltages are to be adjusted to account for voltage drift, which may affect storage elements over time. During a read voltage adjustment operation, the R/W circuitry 180 may determine a first number of detected errors corresponding to the first region of storage elements 106. For example, the R/W circuitry 180 may determine that the first region of storage elements 106 includes the first number of storage elements that store erroneous data.

The R/W circuitry 180 may determine (e.g., confirm) that read voltage thresholds of the first region of storage elements 106 are to remain unchanged in response to determining that the first number of detected errors is less than or equal to a read voltage adjustment threshold. Alternatively, the R/W circuitry 180 may determine that the read voltage thresholds of the first region of storage elements 106 are to be adjusted in response to determining that the first number of detected errors is greater than the read voltage adjustment threshold. The R/W circuitry 180 may adjust the read voltage thresholds in response to determining that the first number of detected errors is greater than the read voltage adjustment threshold.

The R/W circuitry 180 may periodically perform a data move operation to detect defective regions of storage elements that are to be backed-up and marked as unavailable for use. During a data move operation, the R/W circuitry 180 may determine a first number of detected errors corresponding to the first region of storage elements 106. For example, the R/W circuitry 180 may determine that the first region of storage elements 106 includes the first number of storage elements that store erroneous data.

The R/W circuitry 180 may determine (e.g., confirm) that data is to remain stored at the first region of storage elements 106 in response to determining that the first number of detected errors is less than or equal to a data move threshold. Alternatively, the R/W circuitry 180 may determine that the data stored at the first region of storage elements 106 is to be moved to another region of storage elements (e.g., the second region of storage elements 107) in response to determining that the first number of detected errors is greater than the data move threshold. The R/W circuitry 180 may read the data from the first region of storage elements 106 and write the data to another region of storage elements, for example to attempt to store data in fewer defective bit lines, in response to determining that the first number of detected errors is greater than the data move threshold. The R/W circuitry 180 may designate the first region of storage elements 106 as unavailable.

In certain data storage devices, writing data to single level cell (SLC) storage elements may be faster than writing data to multi-level cell (MLC) storage elements. The R/W circuitry 180 may write data to a region of MLC storage elements by initially writing the data to one or more regions of SLC storage elements and subsequently copying the data from the SLC storage elements to the MLC storage elements. The data may be copied from the SLC storage elements to the MLC storage elements using an OCC operation or a copy-through-controller (CTC) operation.

During a CTC operation, the R/W circuitry 180 may read first data from the SLC storage elements and may provide the first data to the controller 120. The controller 120 may generate second data by performing error correction on the first data based on an ECC algorithm. The controller 120 may provide the second data to the R/W circuitry 180. The R/W circuitry 180 may write the second data to the MLC storage elements. During an OCC operation, the R/W circuitry 180 may read the first data from the SLC storage elements and may write the first data to the MLC storage elements, e.g., without an intermediate step of providing the first data to the controller 120 for error correction. The R/W circuitry 180 may perform a test read operation to determine whether to use an OCC operation or a CTC operation to copy data from a region of storage elements to another region of storage elements in response to determining whether the region of storage elements stores more than a number of erroneous values than are correctable by the controller. During a test read operation, the R/W circuitry 180 may determine a first number of detected errors corresponding to the first region of storage elements 106. For example, the R/W circuitry 180 may determine that the first region of storage elements 106 includes the first number of storage elements that store erroneous data. The first region of storage elements 106 may include SLC storage elements.

The R/W circuitry 180 may determine (e.g., confirm) that data is to be copied from the first region of storage elements 106 to a second region of MLC storage elements using an OCC operation in response to determining that the first number of detected errors is less than or equal to an OCC threshold. Alternatively, the R/W circuitry 180 may determine that the data is to be copied from the first region of storage elements 106 to the second region of MLC storage elements using a CTC operation in response to determining that the first number of detected errors is greater than the OCC threshold.

In a particular aspect, the first region of storage elements 106 may be representative of a larger group of storage elements. For example, the first group of SLC storage elements may include the first region of storage elements 106. To illustrate, the first group of SLC storage elements may correspond to a block of storage elements that includes a plurality of pages and the first region of storage elements 106 may correspond to a page of the plurality of pages. The R/W circuitry 180 may determine that data is to be copied from a first group of SLC storage elements to a second group of MLC storage elements using an OCC operation in response to determining that the first number of detected errors is less than or equal to an OCC threshold. Alternatively, the R/W circuitry 180 may determine that the data is to be copied from the first group of SLC storage elements to the second group of MLC storage elements using a CTC operation in response to determining that the first number of detected errors is greater than the OCC threshold.

In a particular aspect, the OCC threshold may correspond to a weighted sum based on the number 113 and a second number of errors (e.g., OCC threshold=first weight (the number 113)+second weight (the second number of errors)). The first weight may have a first value (e.g., 0.5) that is less than a second value (e.g., 1) of the second weight. The second number of errors may be a default value. In a particular aspect, the second number of errors may include a count of first bit lines. A first bit line of the first bit lines may be coupled to a single storage element that is identified as defective during a bit line integrity operation. In a particular aspect, the threshold generator 122 may perform the memory operations 181. In a particular aspect, the controller 120 may determine the second number of errors.

In a particular aspect, the controller 120 may perform at least a portion of the test read operation. For example, the controller 120 may determine whether data is to be copied from a first group of SLC storage elements (e.g., the first region of storage elements 106) to a second group of MLC storage elements using a CTC operation or an OCC operation based on the first number of detected errors and the OCC threshold. The controller 120 may send a request to the R/W circuitry 180 to copy data from a first group of SLC storage elements (e.g., the first region of storage elements 106) to a second group of MLC storage elements in response to determining that the first number of detected errors is less than or equal to the OCC threshold. Alternatively, the controller 120 may, in response to determining that the first number of detected errors is greater than the OCC threshold, send a read request to read first data from the first group of SLC storage elements (e.g., the first region of storage elements 106), may generate second data by performing error correction on the first data, and may send a write request to the R/W circuitry 180 to write the second data to the second group of MLC storage elements.

The R/W circuitry 180 (or the controller 120) may perform control operations (e.g., the memory operations 181) to as part of a memory management scheme. Generating the thresholds 114 based on the number 113 may enable the R/W circuitry 180 (or the controller 120) to perform the control operations based on thresholds (e.g., the thresholds 114) that represent a number of errors that are correctable by the controller 120 in a bad bit line-correction application (rather than a column-replacement application). Bad bit line-correction may increase a number of redundant bit lines that are available to replace bad bit lines, thereby increasing an error tolerance of the memory device 104.

Figure 2:
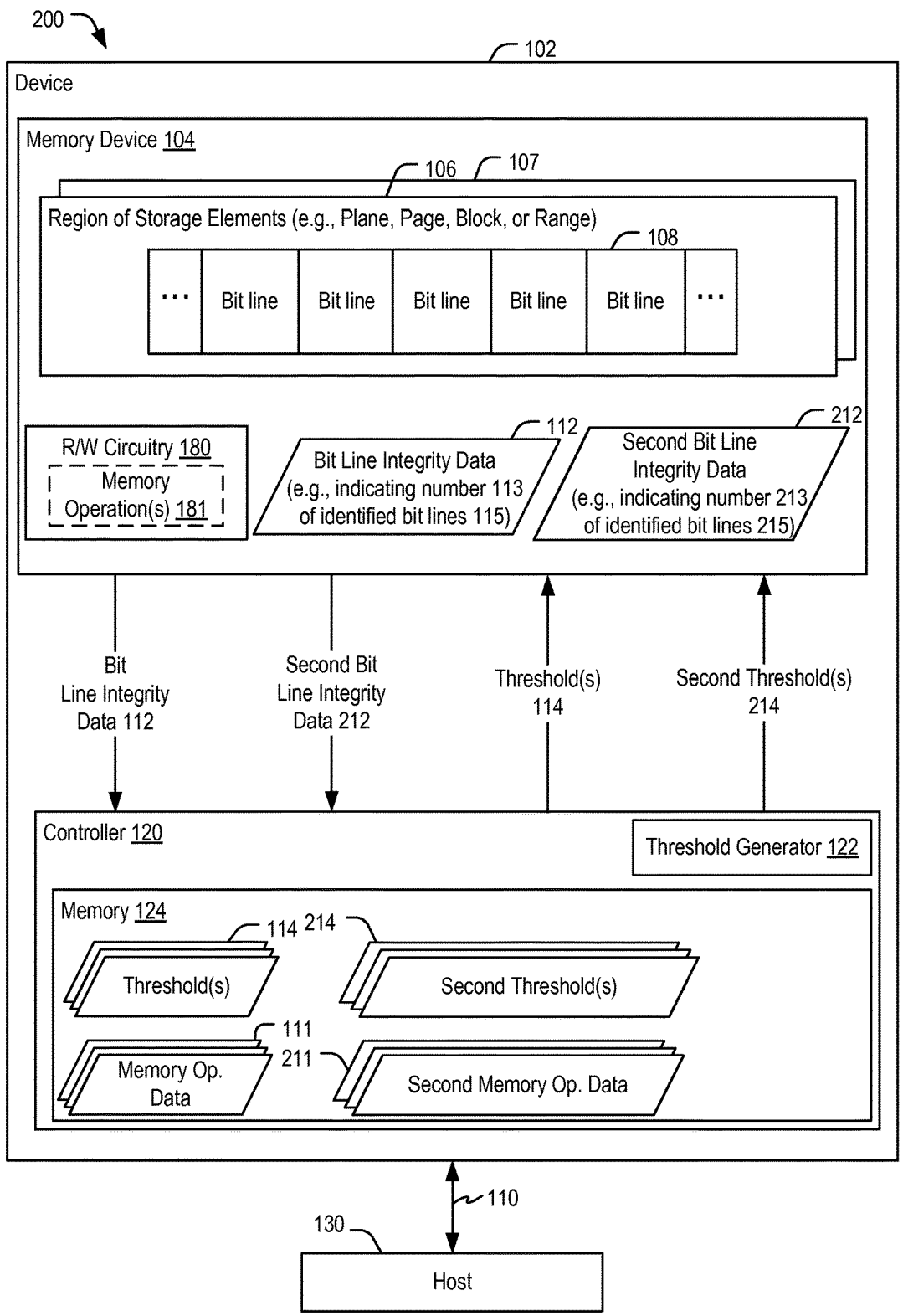
FIG. 2 is a diagram of another illustrative example of a system that includes the device of FIG. 1.

Referring to FIG. 2, a particular illustrative example of a system is depicted and generally designated 200. The system 200 may differ from the system 100 of FIG. 1 in that the system 200 includes second bit line integrity data 212 corresponding to the second region of storage elements 107.

The second bit line integrity data 212 may include bad bit line data corresponding to the second region of storage elements 107. For example, the second bit line integrity data 212 may indicate bit lines 215 of the second region of storage elements 107 that are identified as "bad." The bit lines 215 may be identified during a bit line integrity operation, as further described with reference to FIGS. 3-4. The second bit line integrity data 212 may indicate a number (or count) 213 of the bad bit lines 215.

During operation, the controller 120 may receive the bit line integrity data 112, the second bit line integrity data 212, or both, from the memory device 104. The threshold generator 122 may determine the thresholds 114 based on the bit line integrity data 112, as described with reference to FIG. 1. The threshold generator 122 may also determine one or more second thresholds 214 based on the second bit line integrity data 212. The threshold generator 122 may further determine the memory operation data 111 based on the bit line integrity data 112, and second memory operation data 211 based on the second bit line integrity data 212. The threshold generator 122 may store the memory operation data 111, the second memory operation 211, or both, in the memory 124.

In particular examples, the thresholds 114 may be the same as or may differ from the second thresholds 214. For example, the thresholds 114 may correspond to first values that are distinct from second values corresponding to the second thresholds 214. Alternatively, or in addition, the memory operation data 111 may correspond to first threshold offsets that are distinct from second threshold offsets corresponding to the second memory operation data 211. In some examples, the memory operation data 111 may correspond to first threshold values that are distinct from second threshold values corresponding to the second memory operation data 211.

The R/W circuitry 180 may perform the memory operations 181 (e.g., an erase detection operation, a program confirmation operation, a read voltage adjustment operation, a data move operation, or a test read operation) based on the thresholds 114, the second thresholds 214, or a combination thereof. For example, the R/W circuitry 180 may perform a first erase detection operation, a first program confirmation operation, a first read voltage adjustment operation, a first data move operation, or a first test read operation on the first region of storage elements 106 based on the thresholds 114, as described with reference to FIG. 1. As another example, the R/W circuitry 180 may perform a second erase detection operation, a second program confirmation operation, a second read voltage adjustment operation, a second data move operation, or a second test read operation on the second region of storage elements 107 based on the second thresholds 214, as described with reference to FIG. 1.

Advantageously, memory operations may be performed at various regions of memory using thresholds corresponding to higher error tolerance of a controller. For example, the thresholds may be adjusted (e.g., incremented) based on the number of identified bit lines (e.g., bad bit lines) in a corresponding region of memory.

Figure 3:
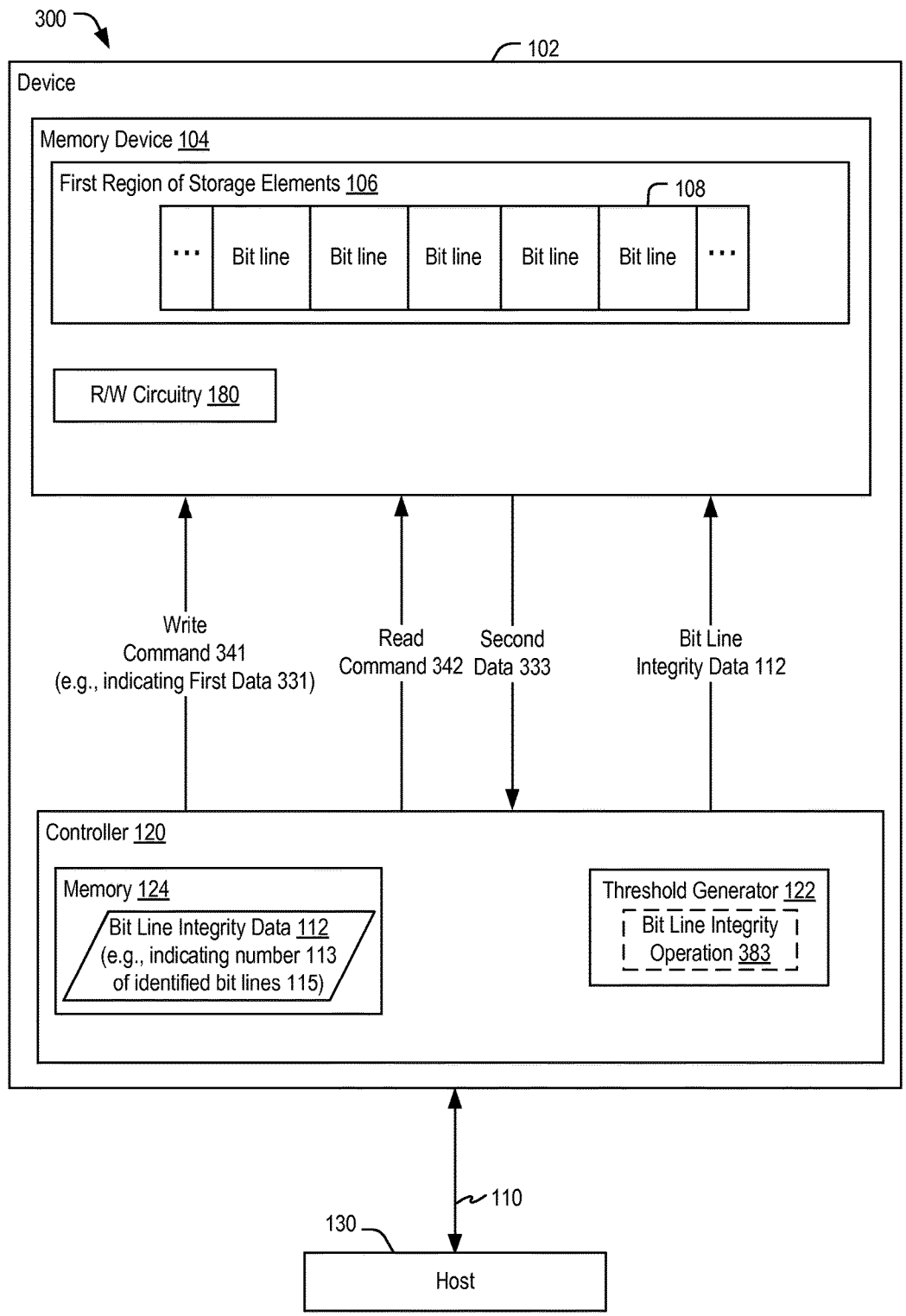
FIG. 3 is a diagram of another illustrative example of a system that includes the device of FIG. 1.

Referring to FIG. 3, a particular illustrative example of a system is depicted and generally designated 300. The system 300 may differ from the system 100 of FIG. 1 in that the controller 120, rather than the memory device 104, is configured to generate the bit line integrity data 112.

For example, the threshold generator 122 may perform a bit line integrity operation 383 on the first region of storage elements 106. To illustrate, the threshold generator 122 may send one or more write commands (e.g., a write command 341) to the memory device 104. The write command 341 may indicate first data 331. The R/W circuitry 180 may, in response to receiving the write command 341, perform a write operation to write the first data 331 to the first region of storage elements 106. The threshold generator 122 may also send one or more read commands (e.g., a read command 342) to the memory device 104. For example, the threshold generator 122 may send the read command 342 to the memory device 104 subsequent to sending the write command 341 to the memory device 104. The R/W circuitry 180 may, in response to receiving the read command 342, perform a read operation to read second data 333 from the first region of storage elements 106. The memory device 104 may provide the second data 333 to the controller 120.

When the first data 331 is written and the second data 333 is read from the same storage elements (e.g., the first region of storage elements 106), in the absence of errors, the first data 331 would be expected to be identical to the second data 333. When the second data 333 is not identical to the first data 331, the threshold generator 122 may identify the bad bit lines 115 based on a comparison of the first data 331 and the second data 333. For example, the threshold generator 122 may identify a bit line as a bad bit line in response to detecting errors in data read from multiple storage elements coupled to the bit line. To illustrate, the threshold generator 122 may determine that a storage element is defective in response to determining that a first value of the first data 331 written to the storage element is distinct from a second value of the second data 333 read from the storage element. The threshold generator 122 may identify a bit line as defective in response to determining that multiple storage elements coupled to the bit are defective.

The threshold generator 122 may issue multiple write commands during the bit line integrity operation 383 to write a set of data to the first region of storage elements 106. The set of data may be designed to detect different types of errors data. For example, the first data 331 may include a first value (e.g., "0") to detect storage elements that incorrectly store a second value (e.g., "1") subsequent to a write of the first value. Other data written to the first region of storage elements 106 may include the second value (e.g., "1") to detect storage elements that incorrectly store the first value (e.g., "0") subsequent to a write of the second value. The threshold generator 122 may store the bit line integrity data 112 in the memory 124. The controller 120 may provide the bit line integrity data 112 to the memory device 104, as shown.

In some examples, the bit line integrity operation 383 may be performed during a memory test of the memory device 104. In a particular implementation, the bit line integrity operation 383 may be performed periodically. The bit line integrity operation 383 may be performed in the background. For example, prior to performing the bit line integrity operation 383, data from the first region of storage elements 106 may be copied to another (e.g., redundant) region of storage elements, such as the second region of storage elements 107 of FIG. 1. To illustrate, the threshold generator 122 may send a backup command to the memory device 104. The R/W circuitry 180 may, in response to receiving the backup command, copy the data from the first region of storage elements 106 to the redundant region of storage elements. The R/W circuitry 180 may redirect read/write accesses from the first region of storage elements 106 to the redundant region of storage elements until the data is restored to the first region of storage elements 106 after the bit line integrity operation 383 is completed. For example, after the bit line integrity operation 383 is completed, the threshold generator 122 may send a restore command to the memory device 104. The R/W circuitry 180 may, in response to receiving the restore command, copy the data from the redundant region of storage elements back to the first region of storage elements 106. The threshold generator 122 may determine the thresholds 114, as described with reference to FIG. 1, subsequent to performing the bit line integrity operation 383.

The system 300 may thus enable the controller 120 to generate bit line integrity data indicating a number of identified bit lines (e.g., bad bit lines). Thresholds may be set or adjusted based on the bit line integrity data.

Figure 4:
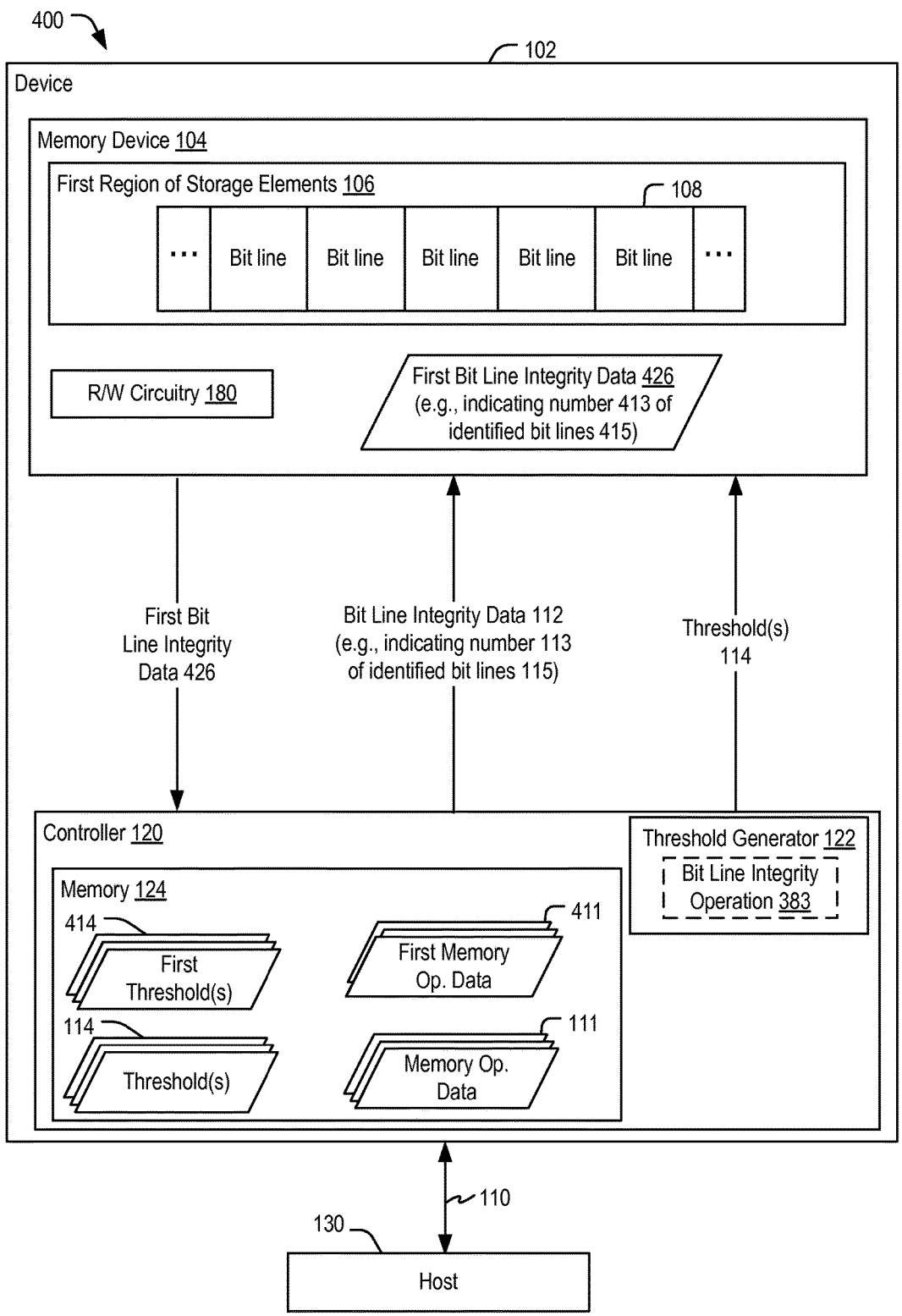
FIG. 4 is a diagram of another illustrative example of a system that includes the device of FIG. 1.

Referring to FIG. 4, a particular illustrative example of a system is depicted and generally designated 400. In the example of FIG. 4, the memory device 104 may store first bit line integrity data 426. The first bit line integrity data 426 may indicate bit lines 415 of the first region of storage elements 106 that have been identified as bad. For example, the first bit line integrity data 426 may indicate a number 413 of the bad bit lines 415. The memory device 104 may provide the first bit line integrity data 426 to the controller 120, such as during an initialization process. The threshold generator 122 may determine first thresholds 414 based on the first bit line integrity data 426, as described with reference to FIG. 1. For example, the threshold generator 122 may generate first memory operation data 411 based on the first bit line integrity data 426 and may update (or generate)

the first thresholds 414 based on the first memory operation data 411, as described with reference to FIG. 1.

The threshold generator 122 may determine the bit line integrity data 112 by performing the bit line integrity operation 383, as described with reference to FIG. 3. The threshold generator 122 may also generate and/or update memory operation data, thresholds, or both, in response to determining that bit line integrity data is updated. For example, the threshold generator 122 may generate and/or update the memory operation data 111, the thresholds 114, or both, responsive to generating the bit line integrity data 112.

The bit line integrity data 112 may be similar to the first bit line integrity data 426. For example, the bit lines 115 may be the same as the bit lines 415, and the number 113 may be equal to the number 413. To illustrate, the threshold generator 122 may determine that the memory operation data 111 is the same as the first memory operation data 411 in response to determining that the number 113 is equal to the number 413. The threshold generator 122 may determine that the thresholds 114 are the same as the first thresholds 414 in response to determining that the number 113 is equal to the number 413. Alternatively, the threshold generator 122 may, in response to determining that the number 113 is not equal to the number 413, generate the memory operation data 111 based on the bit line integrity data 112, as described with reference to FIG. 1.

The threshold generator 122 may generate the thresholds 114 based on the memory operation data 111, as described with reference to FIG. 1. For example, the threshold generator 122 may generate the thresholds 114 by overwriting the first thresholds 414 with threshold values indicated by the memory operation data 111. As another example, the threshold generator 122 may generate the thresholds 114 by updating (e.g., incrementing) the first thresholds 414 based on threshold offsets indicated by the memory operation data 111. The threshold generator 122 may provide the thresholds 114 to the memory device 104.

The system 400 may thus enable the controller 120 to dynamically update memory operation thresholds. The memory operation thresholds may track the number of bad bit lines in a memory device over time.

Figure 5:
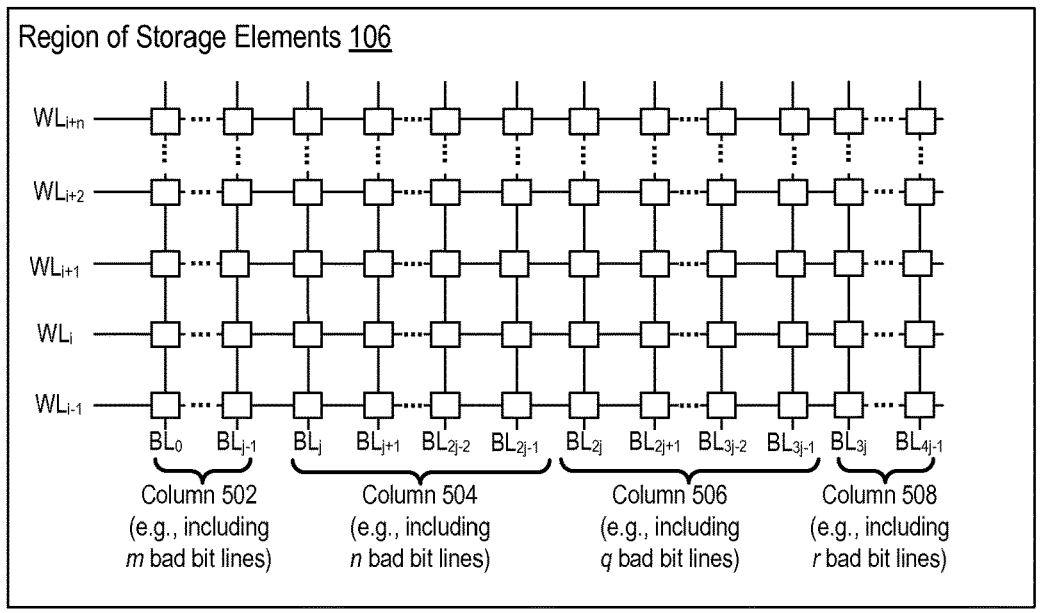
FIG. 5 is a diagram of a particular illustrative example of components that may be included in the device of FIG. 1.

Referring to FIG. 5, illustrative aspects of the first region of storage elements 106 and the memory 124 are shown. The first region of storage elements 106 may include storage elements coupled to a plurality of word lines (WLs) and to a plurality of bit lines (BLs). The first region of storage elements 106 may include a plurality of columns. In the example of FIG. 5, the first region of storage elements 106 includes a column 502, a column 504, a column 506, and a column 508.

Each column may include one or more bit lines. For example, each of the columns 502-508 may include a first number (j) of bit lines. In some implementations, different columns may include different numbers of bit lines.

Each column may include zero or more bad bit lines. In the example of FIG. 5, the column 502 includes a first number (m) of bad bit lines, the column 504 includes a second number (n) of bad bit lines, the column 506 includes a third number (q) of bad bit lines, and the column 508 includes a fourth number (r) of bad bit lines. The bit line integrity data 112 of FIG. 1 may indicate that the number of bad bit lines included in each of the columns 502-508. The threshold generator 122 may determine the number 113 based on a sum of the number of bad bit lines included in each column (e.g., m+n+q+r).

In some examples, the threshold generator 122 generates an estimated number 552 of bad bit lines based on the number 113 and a defect growth model. The defect growth model may predict how many bit lines of the first region of storage elements 106 may become defective over time. In some cases, the defect growth model may indicate that all bit lines of a certain column may become defective. For example, if a column is a "bad" column having at least one bad bit line, the defect growth model that all bit lines of the bad column will eventually become bad.

In some examples, the defect growth model indicates that all bit lines of a bad column that is a non-edge column of a region of storage elements may become defective. In FIG. 5, the right-most column 508 and the left-most column 502 are edge columns. Thus, in this example, based on the defect growth model, the threshold generator 122 may determine that all bit lines of the columns 504 and 506 will eventually become defective. The threshold generator 122 may generate the estimated number 552 based on a sum of the number (m+r) of bad bit lines of the edge columns (e.g., the columns 502 and 508) and the number (2j) of total bit lines of the non-edge bad columns (e.g., the columns 504 and 506).

The threshold generator 122 may also determine a growth potential 550 (e.g., 2j−(n+q)) based on a difference between the estimated number 552 (e.g., m+2j+r) and the number 113 (e.g., m+n+q+r). The growth potential 550 may correspond to a difference between the number of bit lines (e.g., 2j) in the non-edge bad columns (e.g., the columns 504 and 506) and the number of bad bit lines (e.g., n+q) in the non-edge bad columns.

The threshold generator 122 may screen the memory device 104 based on the growth potential 550, the number 113, or both. For example, the threshold generator 122 may designate the memory device 104 as erroneous in response to determining that the number 113, the growth potential 550, or a sum of the number 113 and the growth potential 550 is greater than a screening threshold.

The threshold generator 122 may periodically update the bit line integrity data 112 based on the growth potential 550. For example, the threshold generator 122 may assign a portion (e.g., ¼) of the growth potential 550 to a particular time period (e.g., 6 months). The threshold generator 122 may update (e.g., increment) the number 113 based on the portion of the growth potential 550 (e.g., ¼ (2j−(n+q))) upon expiration of the particular time period.

In some examples, the defect growth model indicates the portions of the growth potential 550 to be assigned to each time period. For example, the defect growth model may indicate that equal portions of the growth potential 550 are to be assigned to each time period (e.g., every 6 months) over a particular duration (e.g., 2 years). The threshold generator 122 may, based on the defect growth model, assign an equal portion (e.g., ¼) of the growth potential 550 to each time period (e.g., every 6 months) over the particular duration (e.g., 2 years). In another example, the defect growth model may indicate that a first portion (e.g., ⅛) of the growth potential 550 that is to be assigned to a first time period (e.g., a first 6 months) is distinct from a second portion (e.g., ½) that is to be assigned to a second time period (e.g., a last 6 months).

FIG. 5 thus illustrates that bit line integrity data may be updated (e.g., periodically) based on a defect growth model. Resources (e.g., time and power) that would have been used in performing bit line integrity operations may be saved by updating the bit line integrity data based on predicted defect growth.

Figure 6:
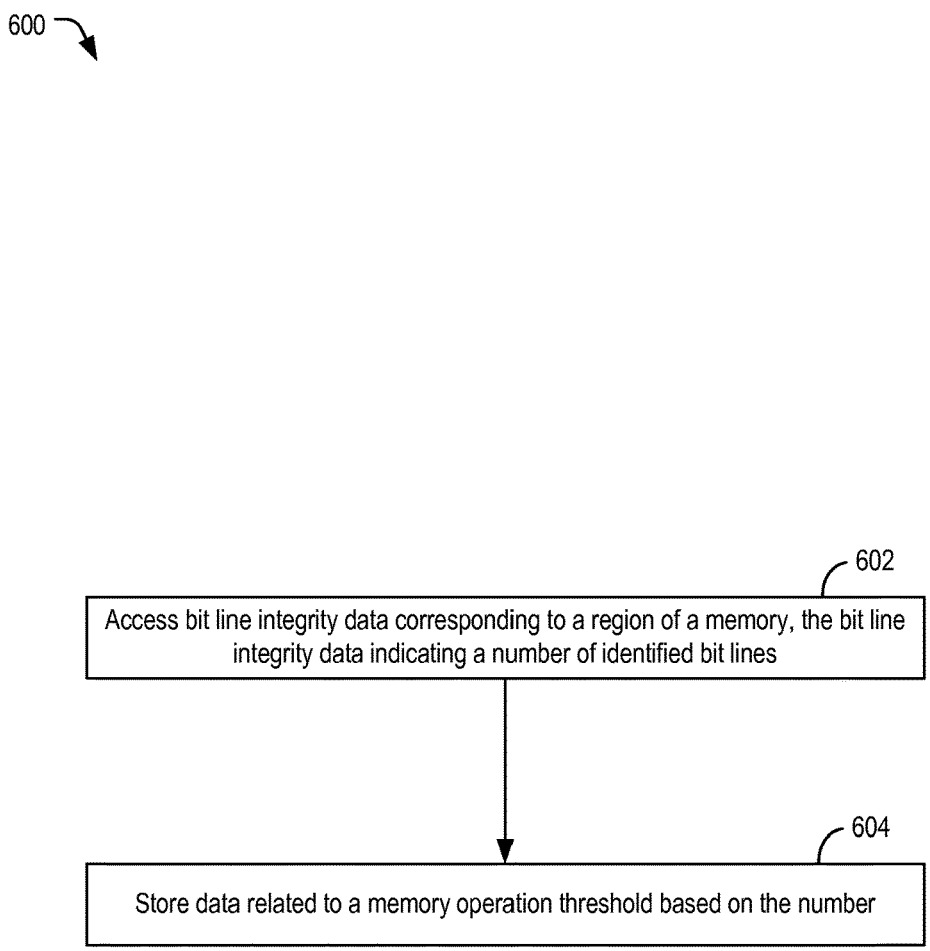
FIG. 6 is a diagram of a particular illustrative example of a method of operation of the device of FIG. 1.

Referring to FIG. 6, an illustrative example of a method is depicted and generally designated 600. The method 600 may be performed by the device 102, the controller 120, the threshold generator 122 of FIGS. 1-4, or a combination thereof.

The method 600 includes accessing bit line integrity data corresponding to a region of a memory, at 602. For example, the threshold generator 122 of FIG. 1 may access the bit line integrity data 112, as described with reference to FIG. 1. The bit line integrity data 112 may correspond to the first region of storage elements 106. The bit line integrity data 112 may indicate the number 113 of bit lines 115 in the first region of storage elements 106 that have been identified as bad.

The method 600 also includes storing data related to a memory operation threshold based on the number, at 604. For example, the threshold generator 122 may store the memory operation data 111 based on the number 113, as described with reference to FIG. 1. The memory operation data 111 may be related to the thresholds 114.

The method 600 may thus enable determining memory operation thresholds based on a number of identified bit lines. Memory operations may be performed using thresholds corresponding to an error tolerance of a controller that is based on the number of bad bit lines.

Figure 7:
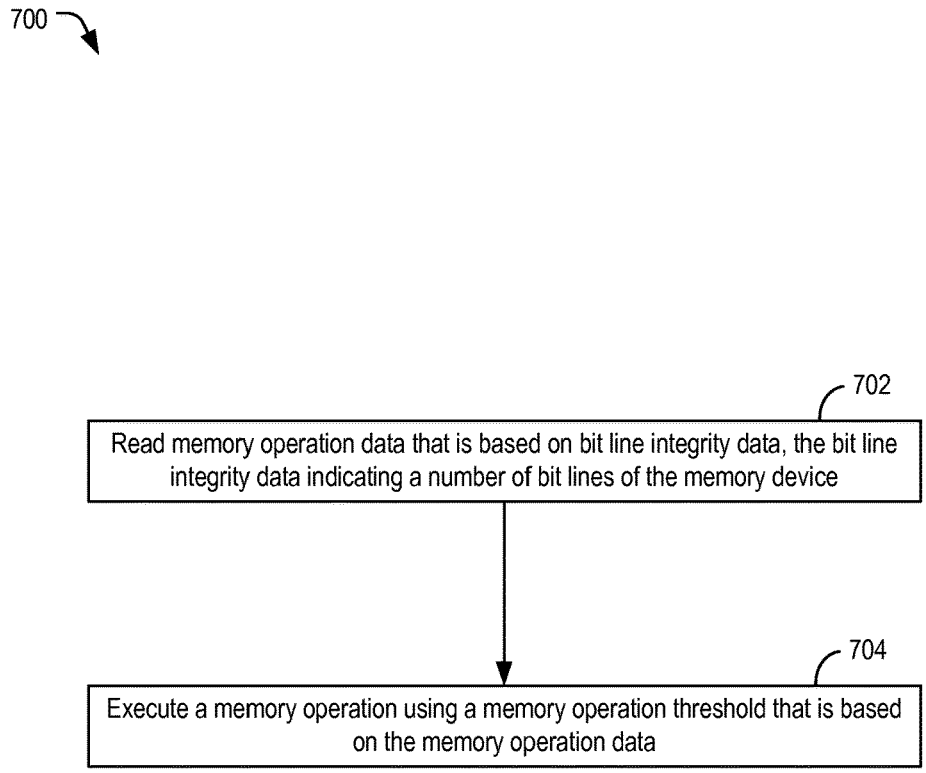
FIG. 7 is a diagram of another particular illustrative example of a method of operation of the device of FIG. 1.

Referring to FIG. 7, an illustrative example of a method is depicted and generally designated 700. The method 700 may be performed by the device 102, the controller 120, the threshold generator 122 of FIGS. 1-4, or a combination thereof.

The method 700 includes reading memory operation data that is based on bit line integrity data, at 702. For example, the threshold generator 122 may read the memory operation data 111, as described with reference to FIG. 1. The memory operation data 111 may be based on the bit line integrity data 112, as described with reference to FIG. 1. The bit line integrity data 112 may indicate the number 113 of bit lines 115 identified as bad.

The method 700 also includes executing a memory operation using a memory operation threshold that is based on the memory operation data, at 704. For example, the controller 120 may execute one of the memory operations 181 using the thresholds 114, as described with reference to FIG. 1. The thresholds 114 may be based on the memory operation data 111, as described with reference to FIG. 1.

The method 700 may enable memory operations to be performed using thresholds corresponding to an error tolerance of a controller that is based on bit line integrity data. The bit line integrity data may indicate a number of bit lines identified as bad (e.g., defective).

In some implementations, a computer-readable medium stores instructions executable by a processor to perform operations described herein. For example, the computer-readable medium may correspond to the memory 124, the instructions may correspond to the instructions 162, and the processor may correspond to the threshold generator 122. The operations may include accessing bit line integrity data (e.g., the bit line integrity data 112) corresponding to a region (e.g., the first region of storage elements 106) of the memory (e.g., the memory device 104). The bit line integrity data may indicate a number (e.g., the number 113) of bit lines (e.g., the bit lines 115 identified as bad). The operations may also include storing data (e.g., the memory operation data 111) related to a memory operation threshold (e.g., one of the thresholds 114) based on the number of bit lines.

Although various components depicted herein are illustrated as block components and described in general terms, such components may include one or more microprocessors, state machines, or other circuits configured to enable such components to perform one or more operations described herein. For example, the threshold generator 122 may represent physical components, such as hardware controllers, state machines, logic circuits, processor(s), or other structures, to enable the controller 120 to access bit line integrity data (e.g., the bit line integrity data 112) corresponding to a region (e.g., the first region of storage elements 106) of the memory (e.g., the memory device 104) and storing data (e.g., the memory operation data 111) related to a memory operation threshold (e.g., the thresholds 114) based on a number (e.g., the number 113) of bit lines (e.g., the bad bit lines 115).

Alternatively or in addition, one or more components described herein may be implemented using a microprocessor or microcontroller programmed to perform operations, such as one or more operations of the method 600 of FIG. 6, the method 700 of FIG. 7, or both. Instructions executed by the threshold generator 122, the controller 120, the R/W circuitry 180, and/or the device 102 may be retrieved from the memory 124 or from a separate memory location that is not part of the memory 124, such as from a read-only memory (ROM).

The device 102 may be coupled to, attached to, or embedded within one or more accessing devices, such as within a housing of the second device 130. For example, the device 102 may be embedded within the second device 130 in accordance with a Joint Electron Devices Engineering Council (JEDEC) Solid State Technology Association Universal Flash Storage (UFS) configuration. To further illustrate, the device 102 may be integrated within an electronic device, such as a mobile telephone, a computer (e.g., a laptop, a tablet, or a notebook computer), a music player, a video player, a gaming device or console, a component of a vehicle (e.g., a vehicle console), an electronic book reader, a personal digital assistant (PDA), a portable navigation device, or other device that uses internal non-volatile memory.

In one or more other implementations, the device 102 may be implemented in a portable device configured to be selectively coupled to one or more external devices, such as the second device 130 (e.g., a host device). For example, the device 102 may be removable from the second device 130 (i.e., "removably" coupled to the second device 130). As an example, the device 102 may be removably coupled to the second device 130 in accordance with a removable universal serial bus (USB) configuration.

In some implementations, the system 100, the device 102, or the memory 124 may be integrated within a network-accessible data storage system, such as an enterprise data system, an NAS system, or a cloud data storage system, as illustrative examples.

In some implementations, the device 102 may include a solid state drive (SSD). The device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the device 102 corresponds to an SSD data storage device that is configured to be embedded within the second device 130 or a removable flash memory data storage device that is configured to be removed from the second device 130. In some implementations, the device 102 may be coupled to the second device 130 (e.g., a host device, an access device, or a test device) via a network. For example, the network may include a data center storage system network, an enterprise storage system network, a storage area network, a cloud storage network, a local area network (LAN), a wide area network (WAN), the Internet, and/or another network.

To further illustrate, the device 102 may be configured to be coupled to the second device 130 (e.g., a host device, an access device, or a test device) as embedded memory, such as in connection with an embedded MultiMedia Card (eMMC®) (trademark of JEDEC Solid State Technology Association, Arlington, Va.) configuration, as an illustrative example. The device 102 may correspond to an eMMC device. As another example, the device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The device 102 may operate in compliance with a JEDEC industry specification. For example, the device 102 may operate in compliance with a JEDEC eMMC specification, a JEDEC Universal Flash Storage (UFS) specification, one or more other specifications, or a combination thereof.

The memory 124 may include a resistive random access memory (ReRAM), a flash memory (e.g., a NAND memory, a NOR memory, a single-level cell (SLC) flash memory, a multi-level cell (MLC) flash memory, a divided bit line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the device 102 is indirectly coupled to the second device 130 (e.g., an accessing device) via a network. For example, the device 102 may be a network-attached storage (NAS) device or a component (e.g., a solid-state drive (SSD) component) of a data center storage system, an enterprise storage system, or a storage area network. The memory 124 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a controller; and
   a memory coupled to the controller, wherein the memory includes storage elements coupled to bit lines,
   wherein the controller is configured to:
   access bit line integrity data corresponding to a region of the memory, the bit line integrity data indicating a number of bit lines with one or more defects;
   adjust a memory operation threshold by a function of the number of bit lines with one or more defects indicated by the bit line integrity data; and
   store data related to the adjusted memory operation threshold to compensate for the number of bit lines with one or more defects.

2. The data storage device of claim 1, wherein the bit line integrity data includes bad bit line data.

3. The data storage device of claim 1, wherein the memory includes a non-volatile memory, and wherein the data is stored in the non-volatile memory.

4. The data storage device of claim 1, wherein the data includes a threshold offset or a threshold.

5. The data storage device of claim 1, further comprising a threshold generator configured to generate the data related to the memory operation threshold.

6. The data storage device of claim 1, wherein storing the data includes overwriting a first threshold with a second threshold.

7. The data storage device of claim 1, wherein the memory includes a plurality of planes, wherein the region includes a first plane of the plurality of planes, and wherein the controller is configured to access second bit line integrity data that corresponds to a second plane of the plurality of planes.

8. The data storage device of claim 1, wherein the bit line integrity data indicates a number of bad bit lines based on a bit line integrity operation.

9. The data storage device of claim 8, wherein a first bit line of the bit lines is identified as a bad bit line in response to detecting errors in data read from multiple storage elements coupled to the first bit line.

10. The data storage device of claim 1, wherein a memory operation includes an erase detection operation, a program confirmation operation, a read voltage adjustment operation, a data move operation, or a test read operation.

11. The data storage device of claim 1, wherein the controller is further configured to generate an estimated number from the number of bit lines based on a defect growth model, and wherein the data is based on the estimated number.

12. A data storage device comprising:
   a controller; and
   a memory coupled to the controller, wherein the memory includes storage elements coupled to bit lines,
   wherein the controller is configured to:
   read memory operation data that is based on bit line integrity data corresponding to a region of the memory, the bit line integrity data indicating a number of bad bit lines;
   adjust a memory operation threshold by a weight selected based on the number of bad bit lines indicated by the bit line integrity data; and
   perform a memory operation using the memory operation threshold to compensate for the number of bad bit lines.

13. The data storage device of claim 12, wherein the controller is configured to detect an update of the bit line integrity data.

14. The data storage device of claim 12, wherein the memory operation includes an erase detection operation, a program confirmation operation, a read voltage adjustment operation, a data move operation, or a test read operation.

15. A method occurring at a data storage device that includes a controller coupled to a memory device, the method comprising:

reading memory operation data that is based on bit line integrity data, the bit line integrity data indicating a number of bit lines with one or more defects of the memory device;

adjusting a memory operation threshold by a function of the number of bit lines with one or more defects indicated by the bit line integrity data; and executing a memory operation using the adjusted memory operation threshold to compensate for the number of bit lines with one or more defects.

16. The method of claim 15, further comprising determining an estimated number from the number of bit lines based on a defect growth model, wherein the memory operation data is based on the estimated number.

17. The method of claim 15, further comprising updating the memory operation data in response to determining that the bit line integrity data is updated.

18. The method of claim 15, further comprising, prior to executing the memory operation, updating the memory operation threshold based on a threshold offset, wherein the memory operation data includes the threshold offset.

19. The method of claim 15, wherein the memory operation threshold indicates an error tolerance associated with the memory operation.

20. The method of claim 15, further comprising:

writing first data to storage elements of the memory device;

reading second data from the storage elements; and identifying the bit lines based on a comparison between the first data and the second data.

* * * * *